US 6,799,939 B2

(12) United States Patent
Lowrance et al.

(10) Patent No.: US 6,799,939 B2
(45) Date of Patent: Oct. 5, 2004

(54) MULTIPLE INDEPENDENT ROBOT ASSEMBLY AND APPARATUS FOR PROCESSING AND TRANSFERRING SEMICONDUCTOR WAFERS

(75) Inventors: Robert B. Lowrance, Los Gatos, CA (US); Howard Grunes, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 12 days.

(21) Appl. No.: 10/378,864

(22) Filed: Mar. 5, 2003

(65) Prior Publication Data

US 2003/0180139 A1 Sep. 25, 2003

Related U.S. Application Data

(60) Continuation of application No. 10/047,340, filed on Oct. 23, 2001, now abandoned, which is a division of application No. 09/908,360, filed on Jul. 17, 2001, which is a division of application No. 08/608,237, filed on Feb. 28, 1996, now Pat. No. 6,102,164.

(51) Int. Cl.[7] ............................................... B66F 11/00
(52) U.S. Cl. ...................................... 414/814; 414/800
(58) Field of Search ................................ 414/800, 804, 414/805, 806, 807, 814

(56) References Cited

U.S. PATENT DOCUMENTS 5,823,736 A * 10/1998 Matsumura .................. 414/609

* cited by examiner

Primary Examiner—Donald W. Underwood
(74) Attorney, Agent, or Firm—Kenyon & Kenyon

(57) ABSTRACT

A robot assembly including multiple independently operable robot assemblies are provided for use in semiconductor wafer processing. The robot assembly includes independent co-axial upper and lower robot assemblies adapted to handle multiple objects. The upper robot is stacked above the lower robot and the two robots are mounted concentrically to allow fast wafer transfer. Concentric drive mechanisms may also be provided for imparting rotary motion to either rotate the robot assembly or extend an extendable arm assembly into an adjacent chamber. Each robot can be either a single blade robot or a dual blade robot. Also provided is an apparatus for processing semiconductor wafers comprising a pre/post process transfer chamber housing multiple independent robot assemblies and surrounded by a plurality of pre-process chambers and post process chambers. Within each process, pre-process and post-process chamber is an apparatus for holding a plurality of stacked wafers. The apparatus includes a wafer lifting and storing apparatus exhibiting a plurality of vertically movable lift pins surrounding the chamber pedestal. The lift pins are configured to receive and hold a plurality of stacked wafers, preferably two, therein.

10 Claims, 13 Drawing Sheets

MULTIPLE INDEPENDENT ROBOT ASSEMBLY AND APPARATUS FOR PROCESSING AND TRANSFERRING SEMICONDUCTOR WAFERS

RELATED APPLICATION

This application is a Continuation of U.S. patent Application Ser. No. 10/047,340, filed on Oct. 23, 2001 abandoned, which is a Divisional of U.S. patent application Ser. No. 09/908,360, filed on Jul. 17, 2001, which is a Divisional of Ser. No. 08/608,237, filed Feb. 28, 1996, and now issued as U.S. Pat. No. 6,102,164.

BACKGROUND OF THE INVENTION

The present invention relates to an apparatus for transferring objects, and more particularly to multiple independent robot assemblies for the simultaneous and independent manipulation of multiple objects, such as semiconductor wafers.

The use of robot arms is a well established manufacturing expedient in applications where human handling is inefficient and/or undesired. For example, in the semiconductor arts robot arms are used to handle wafers during various process steps. Such process steps include those which occur in a reaction chamber, e.g. etching, deposition, passivation, etc., where a sealed environment must be maintained to limit the likelihood of contamination and to ensure that various specific processing conditions are provided.

Current practice includes the use of robot arms to load semiconductor wafers from a loading port into various processing ports within a multiple process chamber system. The robot arms are then employed to retrieve the wafer from a particular port after processing within an associated process chamber. The wafer is then shuttled by the robot arms to a next port for additional processing. When all processing of the wafer within the system is complete, the robot arm returns the semiconductor wafer to the loading port and a next wafer is placed into the system by the robot arm for processing. Typically, a stack of several semiconductor wafers is handled in this manner during each process run, and several wafers are passing through the system simultaneously.

In multiple chamber process systems, it is desirable to have more than one semiconductor wafer in process at a time. In this way, the process system is used to obtain maximum throughput. A typical wafer handling sequence to switch wafers in a process chamber is to remove a wafer from a process chamber, store the wafer in a selected location, pick a new wafer from a storage location, and then place the new wafer in the process chamber. Although this improves use of the system and provides improved throughput, the robot arm itself must go through significant repetitive motion to simply exchange wafers.

To increase the efficiency of robot handling of wafers, a robot arm having the ability to handle two wafers at the same time may be provided. Thus, some equipment manufacturers have provided a robot in which two carrier arms are located at opposed ends of a support, and the support is rotated about a pivot. In this way, one wafer may be stored on one arm while the other arm is used to retrieve and place a second wafer. The arms are then rotated and the stored wafer may be placed as desired. Such a mechanism does not allow the two arms to be present in the same process chamber at the same time, nor does it allow for the immediate replacement of a fresh wafer in a process chamber after a processed wafer is removed, because the support must be rotated 180° to place the wafer on the second arm in a position for loading into the location from which the first wafer was removed. Likewise, simultaneous use of the two arms for placement or removal of wafers from process or storage positions is not possible with this configuration.

Another robot configuration includes a central hub having two opposed arms, each arm arranged for rotation relative to the hub while arcuately fixed in relation to one another. A blade is linked to the free ends of the arms, and a drive is provided for rotating the arms in opposite directions from each other to extend the blade radially from the central hub, and in the same direction to effect a circular movement of the blade about the central hub. Preferably, a second pair of arms extend opposed from the first pair, on the ends of which is connected a second blade. Opposed rotation of the arms in one direction extends the first arm while retracting the second arm. Opposed rotation of the arms in the opposite direction results in retraction of the first arm and extension of the second arm. Simultaneous motion of the arms in the same direction swings the blades in a circular or orbital path around the hub. The use of two blades increases throughput. However, this device still does not permit simultaneous insertion of a fresh wafer into a process chamber as a processed wafer is being withdrawn from the same chamber, or independent use of the blades to simultaneous load into wafers, unload from, wafers or move a wafer between one or more chambers while a second wafer is being loaded or unloaded.

SUMMARY OF THE INVENTION

The present invention is a multiple robot assembly including at least coaxial upper and lower robot assemblies. The upper robot operates independently of the lower robot to obtain improved throughput and increased wafer handling capacity of the robot assembly as compared to the prior art opposed dual blade robots. The upper robot may be stacked above the lower robot and the two robots may be mounted concentrically to allow fast wafer transfer. Each robot can be either a single blade robot or a dual blade robot.

According to one aspect of the invention, each of the upper and lower robot assemblies is a dual blade robot including a pair of extendable arm assemblies located within a transfer chamber. Each pair of extendable arm assemblies includes a corresponding pair of carrier blades for handling various objects, such as semiconductor wafers. The upper robot may be provided with a drive mechanism for rotating the pair of extendable arm assemblies or for extending one of the arm assemblies into an adjacent chamber. The lower robot may also be provided with a drive mechanism that is coaxial with the upper robot drive mechanism. The lower robot drive mechanism may also function to either rotate the pair of extendable arm assemblies or to extend one of the arm assemblies into an adjacent chamber.

According to another aspect of the invention, each of the upper and lower robot assemblies is a single blade robot including an extendable arm assembly located within a transfer chamber. Each extendable arm assembly includes a corresponding carrier blade for handling various objects, such as semiconductor wafers. The upper and lower robot assemblies may be provided with a drive mechanism for rotating the extendable arm assembly or for extending their arm assemblies into an adjacent chamber.

In a further aspect of the invention, a central transfer chamber is linked to multiple object rest positions, and each of the rest positions may be independently and, if desired, simultaneously accessed by at least two robot assemblies.

A still further aspect of the present invention is an apparatus for holding a plurality of articles within a chamber, such as a pre-process chamber, process chamber or post-process chamber, with a pedestal centrally located and vertically movable therein. The apparatus exhibits a wafer lifting and storing apparatus including a plurality of vertically movable lift pins surrounding the pedestal. The lift pins are configured to receive and hold a plurality of stacked wafers, preferably two, therein. Each one of the plurality of lift pins preferably comprises a lower lift pin segment exhibiting a lower wafer support surface proximal to the upper end thereof, and an upper life pin segment hingedly connected to the lower lift pin segment and exhibiting an upper wafer support surface proximal to an upper end thereof. Means for moving the upper lift pin segment between a position in which the lower lift pin segment is exposed and a position wherein the lower lift pin segment is covered by the upper lift pin segment may also be provided.

DETAILED DESCRIPTION

Figure 1:
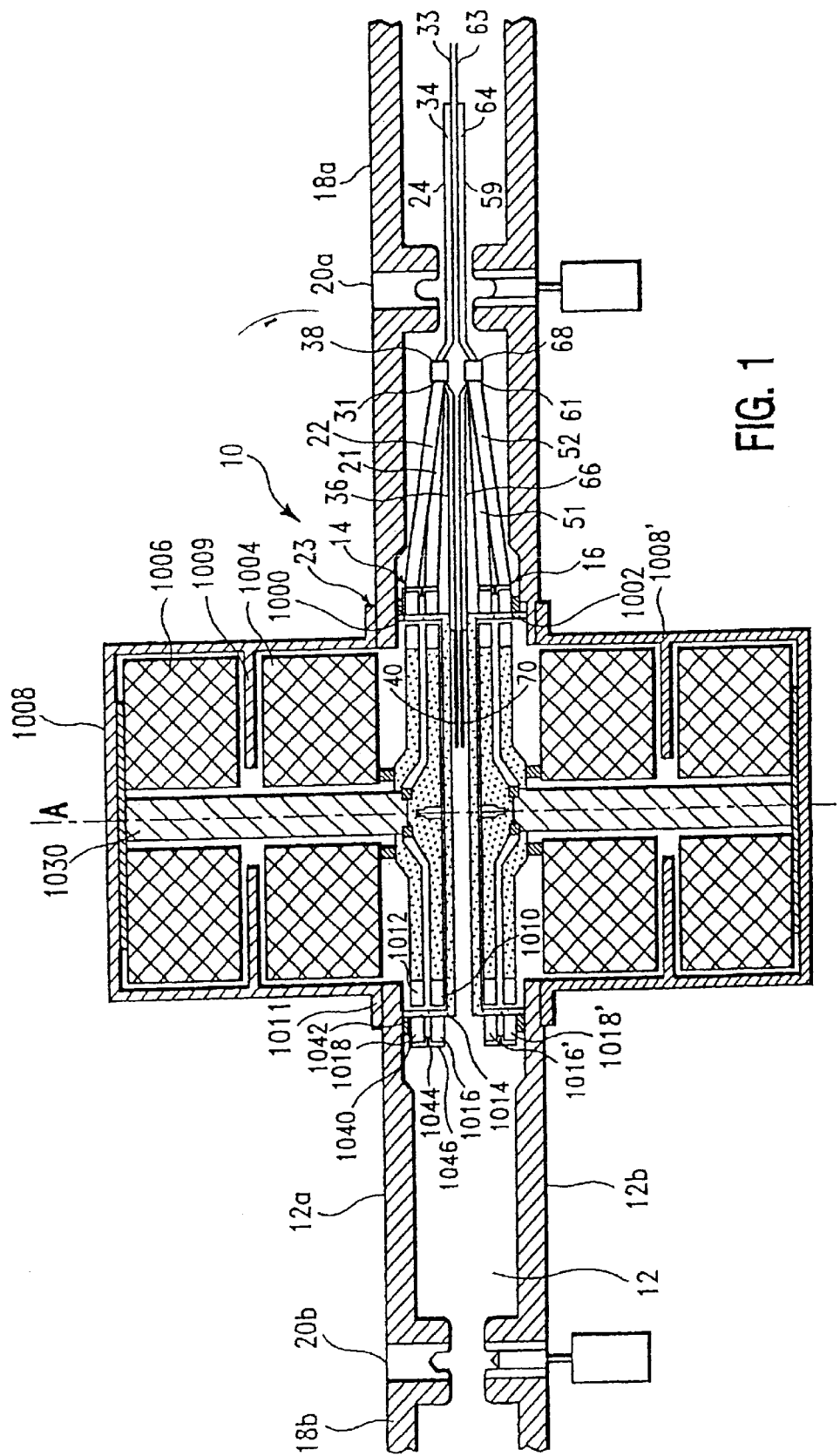
FIG. 1 is a side sectional view of a dual robot assembly according to a first embodiment of the present invention.

The present invention is best understood by referring to the Drawings in connection with review of this Description.

The present invention is a multiple robot assembly including at least independent coaxial upper and lower robot assemblies adapted to simultaneously handle multiple objects. In a preferred embodiment, the upper robot is stacked above the lower robot and the two robots are mounted concentrically to a drive hub to allow simultaneous transfer of two wafers between a transfer chamber and one or more process chambers. Concentric drive mechanisms may also be provided for imparting rotary motion to the connection of the robot assembly to the hub to either move the robot assembly in an orbital path about the hub, i.e., in a sweeping motion, or to extend an extendable arm assembly of the robot assembly. Each robot can be either a single blade robot or a dual blade robot. The invention may preferably be used in a semiconductor wafer processing system.

Figure 7:
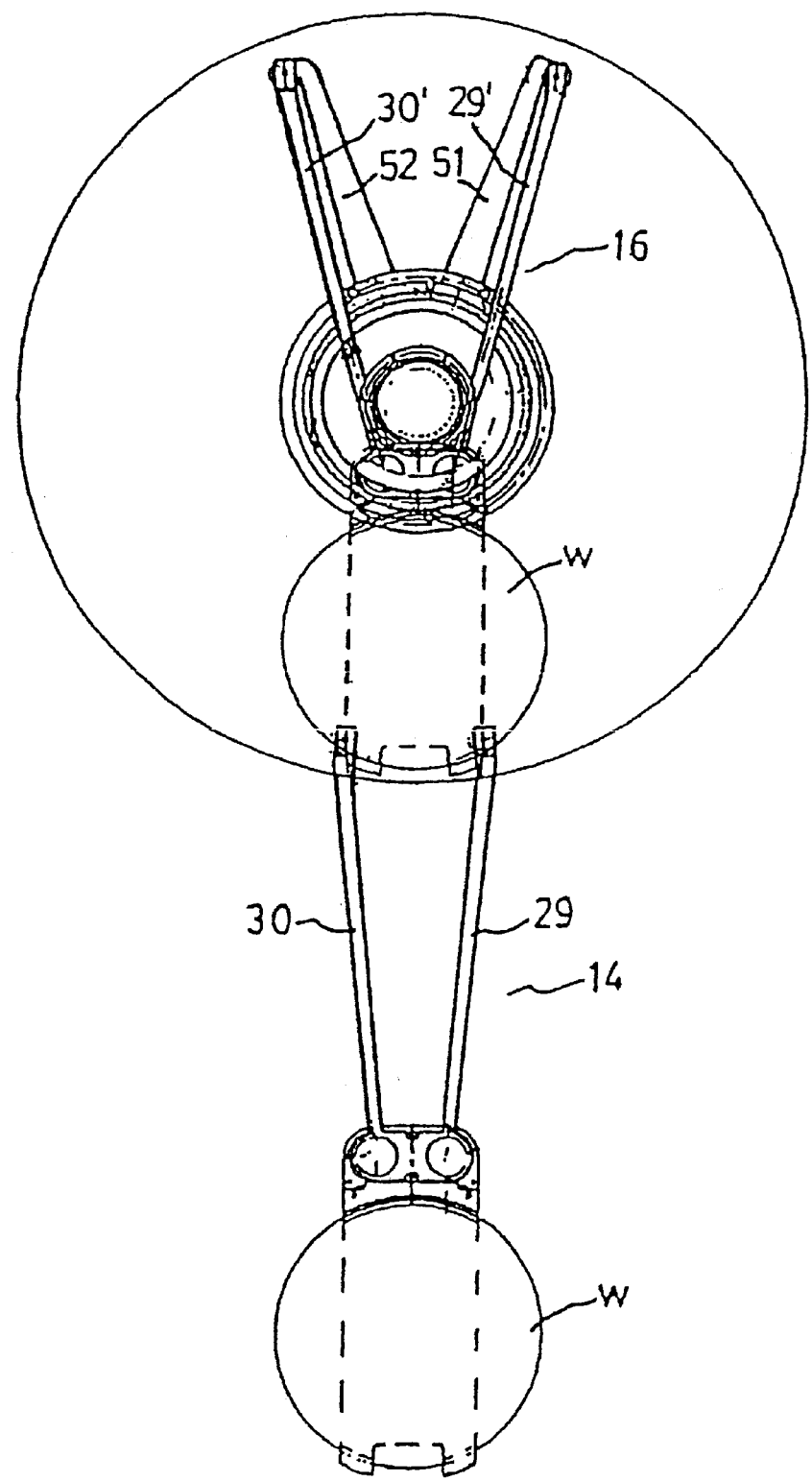
FIG. 7 is a top sectional view of the dual robot assembly of FIGS. 5–6, shown with the lower robot arm assembly in the extended position.

The present invention allows multiple objects; such as semiconductor wafers, to be handled simultaneously for either extension or retraction, with respect to a process chamber position, or rotation about a hub, such that a wafer exchange in a process chamber can rapidly be made. For instance, a wafer which has just completed processing in a processing module can be withdrawn from the module while a fresh wafer is simultaneously being inserted into the same processing module, without the need to swing the robot arm to locate an opposed robot arm in position to insert a new wafer. Alternatively, one robot can be inserting or withdrawing wafer from one processing module while the other robot is independently inserting or withdrawing a wafer from another process module, even where the access to the two chambers are not co-linearly opposed (FIG. 7). Likewise, a wafer may be removed from a process module, and a new wafer inserted therein, without the need to rotate the robot assembly 180° to affect insertion of the new wafer into the module. It is also possible to use the dual robot assembly to simultaneously insert a pair of wafers into, or withdraw a pair of wafers from the same process module at the same time, provided adequate clearance is maintained between the stacked robot assemblies. These unique features enable increased throughput of wafers during wafer processing when contrasted to prior art robot assemblies, as there is no "dead-time" of one of the blades while a processed wafer is replaced within the process module by a fresh wafer, or, as the robot has to eight rotate 180° where dual, opposed, blades are used, or where the removed wafer must be placed in a rest location, and a new wafer positioned on the robot and then transferred to the process chamber.

In FIG. 1, one embodiment of a dual robot assembly 10 is shown in the context of a semiconductor wafer processing system, when one arm of each robot is shown extended into an adjacent chamber 18a, while an opposed arm of each robot is fully retracted into the transfer chamber 12 from an additional chamber 18b. In this Figure, as well as FIGS. 3, 6, and 9, the size of the assembly within which the robot arm drive components are located has been exaggerated to enhance detail. The exemplary processing system includes a transfer chamber 12, within which the robot assembly 10 is mounted, which is connected to at least two additional chambers 18a, 18b. The chambers 18a, 18b may be process chambers, wafer holding chambers, load-lock chambers, etc., into which wafers may be located for wafer processing and then removed. The dual robot assembly 10 is centrally arranged within the transfer chamber 12 of the wafer processing system, wherein the upper robot 14 is preferably connected to an upper superstructure (or wall) 12a of the transfer chamber 12 and a lower robot 16 is preferably connected to the bottom wall 12b of the transfer chamber 12. The upper and lower robots 14, 16 are arranged within the transfer chamber 12 such that semiconductor wafers W (best shown in FIG. 2) can be transferred to and between wafer rest positions adjacent process or reaction chambers 18a, 18b through apertures between the transfer chamber 12 and process chambers 18a, 18b. Preferably, the aperture between the transfer chamber and process chamber is valved, such as with valves 20a, 20b, respectively, so that a process or conditioning environment may be maintained in process chambers 18a, 18b without affecting the environment in the transfer chamber. However, the invention has equal utility where the aperture is not valved. The valves 20a, 20b, where used, may be Vat® valves or vat type valves as shown in FIG. 1, alternatively, pocket valves, gate type valves, flap type valves, slit valves such as those shown and described in U.S. Pat. No. 5,226,632, incorporated herein by reference, or other valves known in the art for separating adjacent chambers and controlling the passage or port therebetween may be used. It should be noted that although the exemplary embodiment of the invention shown in FIG. 1 shows a dual robot assembly centrally located within the central transfer chamber of a multi chamber wafer processing system, with the system including two shown process or reaction chambers (other's being blocked by the robot or in the portion removed for sectional viewing). The present invention is intended for many different applications, particularly those having multiple process and wafer handling chambers ported to a transfer chamber. Additionally, it is specifically contemplated that several transfer chambers may be ganged together, with or without load-locked passages therebetween, and the robot(s) of the present invention may be located in one or all of the transfer chambers. Thus, the exemplary embodiment should not be considered as limiting the scope of the invention. The present invention is readily adapted for use with any wafer handling application, including process systems having any number of process chambers and any sort of orientation for the dual robot assembly.

Referring still to FIG. 1, a specific configuration of an upper robot 14 includes a first drive arm 21 and a second drive arm 22 arranged such that one end of each arm is independently coupled to a central hub 23. The end of each arm 21, 22 coupled to the hub 23 may be moved independently of the other arm in either a clockwise or a counterclockwise fashion about the hub 23, enabling the arms 21, 22 to be moved in either the same or opposed directions. Movement may be accomplished by any type of drive mechanism, such as an electrical, magnetic or electromagnetic motor or motors. The drive mechanism is preferably configured to move drive arm 21 and drive arm 22 in either opposing directions or in the same direction. By moving the hub end of the arms 21, 22 in the same direction about the hub axis A, the robot moves in a circular or orbital path about the hub. By moving the hub ends of the arms in opposite directions about the hub axis A, extension and retraction of the robot is affected. When arm 21 is moved clockwise (from a perspective above cover 12a) and arm 22 is rotated counterclockwise, the robot blade attached to the arms 21, 22 extends from the hub. When the rotation is reversed, that blade retracts toward the hub.

Referring still to FIG. 1, there is shown an enlarged view of the preferred robot drive system. This drive system is the preferred drive system for each embodiment of the robot described herein. In the embodiment shown, each of the upper robot and lower robot assemblies are driven by separate magnetic coupling assemblies 1000, 1002 (shown in FIG. 1). The details of construction of each magnetic coupling assembly 1000, 1002 are identical, except as noted herein. Therefore, only the construction of upper magnetic coupling assembly will be discussed.

Magnetic coupling assembly 1000 is configured to provide arcuate motion of arms 21, 22, about axis A, thereby enabling extension and retraction of the two robot blades 33, 40 from the hub, and passage of the blades in a orbital path about the hub. Additionally, the magnetic coupling assembly 1000 provides this motion with minimal contacting moving parts within the vacuum to minimize particle generation in the vacuum. In this embodiment these robot features are provided by fixing first and second syncro motors 1004, 1006 in a housing 1008 located atop the transfer chamber, and coupling the output of the motors 1004, 1006 to magnet ring assemblies 1010, 1012 located inwardly and adjacent a thin walled section 1014 of housing 1008. The thin walled section 1014 is connected to the upper wall or cover 12a of the transfer chamber 12 at a sealed connection to seal the interior of the transfer chamber 12 from the environment outside of the chambers. Driven magnet rings 1016, 1018 are located on the vacuum side of housing 1008, adjacent to and surrounding thin walled section 1014 of housing 1008. The first magnetic ring assembly 1010 magnetically couples to first driven magnetic ring assembly 1016 and the second magnetic ring 1012 couples to the second driven magnetic ring assembly 1018. Arms 21, 22 are coupled to receptive ones of the driven magnet rings 1016, 1018. Thus, rotary motion of the motors 1002, 1004 is magnetically transferred from the atmospheric to vacuum side of the housing 1008, to cause arcuate motion of arms 21, 22 to affect movement of the robot blades 33, 40 (FIG. 1).

The preferred motor 1004, 1006 construction is a servo motor with a synchronous device, wherein a stator is coupled to a rotor and the arcuate position of the rotor may be closely controlled. As shown in FIG. 1, each motor 1004, 1006 is attached to the housing 1008, at support 1009 such that the rotors thereof are directly coupled to the first magnetic ring assembly 1010 and second magnetic ring assembly 1012. The output of motor 1004 is directly coupled to magnetic ring assembly 1010, and motor 1006 is coupled to magnetic ring assembly 1012 by extending a shaft 1030 from the rotor of motor 1006 and through the center of motors 1004, 1006 where it connects to second magnetic ring assembly 1012. Shaft 1030 is preferably pivotal and supported on bearing 1032 and internal bearings (not shown) in each motor 1004, 1006 between each stator-rotor set ensure centering of the shaft 1030.

Rotation of the motor output thereby causes rotation of the magnet ring assemblies 1010, 1012, which magnetically couple to driven magnetic ring assemblies 1016, 1018, thereby rotating the base of each arm around the perimeter of thin walled section 1014 to affect movement of the blades.

Operation of the robot blades in and out of valves requires close vertical (where the transfer of wafers is horizontal) tolerance on the position of the robot blade, to ensure that it, or the wafer attached thereto, does not hit the structure of the chamber as it passes through the valve. To provide this vertical positioning, the support 1009 extends from between motors 1004, 1006 to a flange 1011 which is connected to cover 12a. The support 1009, flange 1011 and flange to support distance are sized, with respect to the size and tolerance of the robot assemblies, transfer chamber 12 and valves 20a, 20b, to ensure that a blade 33, 40 with a wafer W thereon will not contact the structure of the chambers or valves. To suspend the driven magnetic ring assemblies 1016, 1018, and enable rotation thereof relative to the hub 1008, the first driven magnetic ring assembly 1018 includes an annular arm support 1040, which is received over, and hangs on, race of a first bearing 1042. The first bearing 1042 is clamped, over its inner race, to the thin walled section 1014. The outer race of a second bearing 1044 is clamped to the ring 1040, and ledge portion 1046 of the second magnetic ring assembly 1016 is clamped to race of the second bearing, securing the second driven magnetic ring assembly 1018 to the housing 1008.

Each bearing, is a "cross" type bearing, which provides radial and longitudinal, in this case elevational, support to ensure alignment and positioning of the driven magnetic ring assemblies 1016, 1018.

To couple each magnet ring assembly 1010, 1012 to its respective driven magnetic ring assembly 1016, 1018, each magnet ring assembly 1010, 1012 and driven magnetic ring assembly 1016, 1018 preferably include an equal plurality of magnets, each magnet on the magnet ring assemblies 1010, 1012 coupled to one magnet on the driven magnetic ring assembly 1016, 1018. To increase coupling effectiveness, the magnets may be positioned with their poles aligned vertically, with pole pieces extending therefrom and toward the adjacent magnet to which it is coupled. The magnets which are coupled are flipped, magnetically, so that north pole to south pole coupling occurs at each pair of pole pieces located on either side of the thin walled section.

Lower robot assembly 16 is substantially identical in construction to upper robot assembly, except the housing 1008' thereof is suspended from the transfer chamber 12, and the driven magnetic ring assemblies 1016', 1018', are supported on bearings which rest upon the base of the transfer chamber 12.

Figure 2:
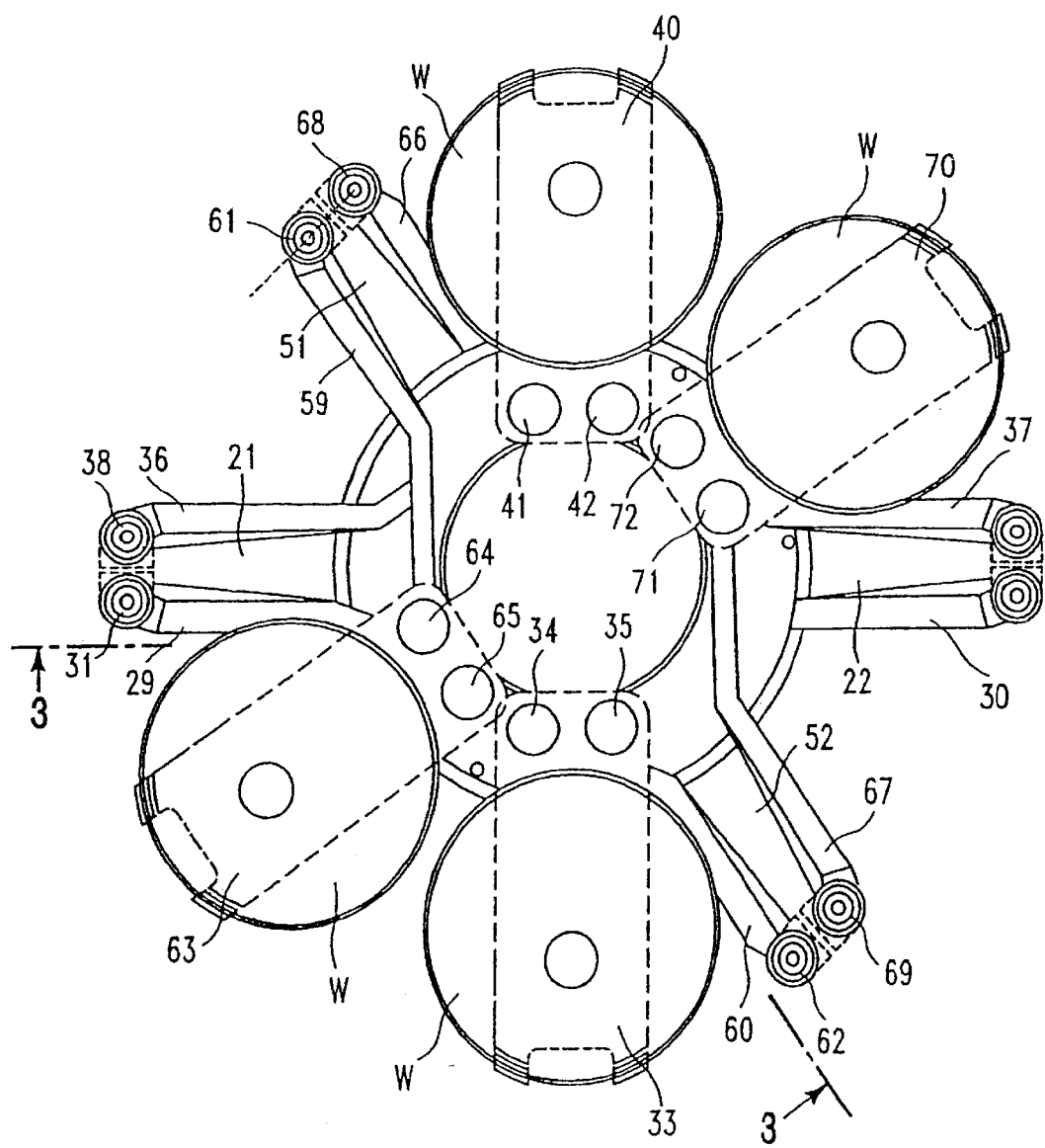
FIG. 2 is top sectional view of the dual robot assembly of FIG. 1, shown with all arm assemblies in the retracted position.
Figure 4:
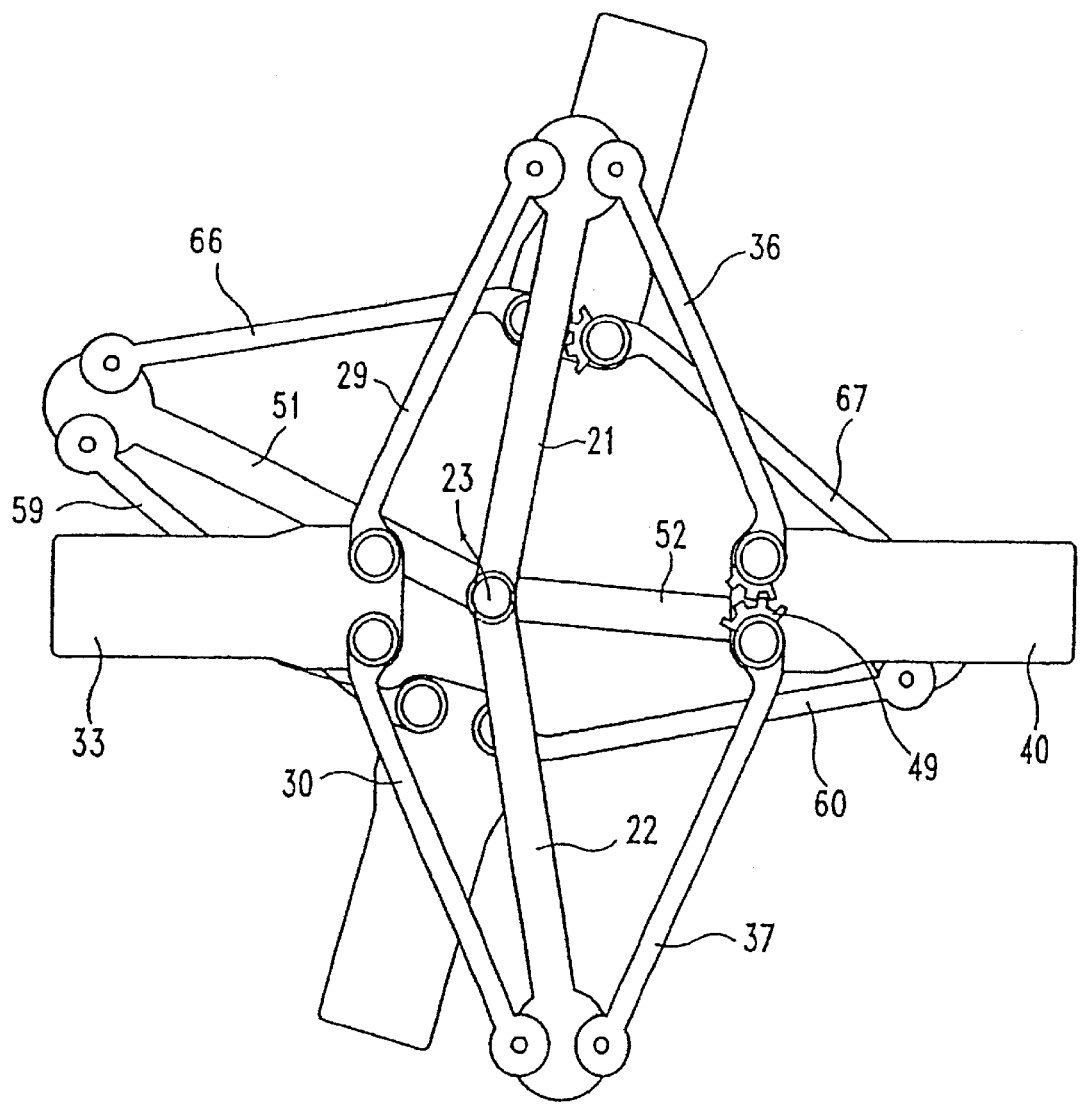
FIG. 4 is a schematic plan view of a dual blade robot arm assembly of the dual robot assembly shown in FIGS. 1–3.

As best shown in FIGS. 2 and 4 (FIG. 4 being a simplified schematic of FIG. 2), a pair of extendable arm assemblies are connected to the ends of the drive arms 21, 22 to form a pair of compound articulated mechanisms which are sometimes referred to in the mechanical arts as frog-leg mechanisms. The first extendable arm assembly includes a pair of strut arms 29, 30 pivotally coupled to the ends of drive arms 21, 22, respectively, at respective pivot points 31, 32. The strut arms 29, 30, in turn, are coupled by pivots 34, 35 to a first wafer carrier or robot blade 33 which forms the object support. The second extendable arm assembly similarly includes a pair of strut arms 36, 37 pivotally coupled to the ends of drive arms 21, 22, respectively, at respective pivot points 38, 39. The strut arms 36, 37 in turn, are coupled by pivots 41, 42 to a second wafer carrier or robot blade 40. Each strut arm 29, 30, 36, 37 may include a meshing gear 49, shown in FIG. 4, at an end within the carrier 40 (or 33) to maintain the carrier in rigid radial alignment with the hub 23 as the struts are pivoted during operation of the robot. The first and second wafer carriers 33, 40 are maintained 180° apart from each other about the axis of the hub. In FIG. 1, the wafer carrier 33 is shown in a fully extended position for delivering or retrieving a wafer from reaction chamber 18a.

Like the upper robot, the lower robot 16 includes a first drive arm 51 and a second drive arm 52 arranged such that one end of each arm is coupled to a central hub 53. The manner of moving the components of the lower robot are identical to that described above in connection with the upper robot. Similarly, the drive mechanism of the lower robot is identical to that of the upper robot.

Also like the upper robot, in the lower robot 16, a pair of extendable arms assemblies are connected to the ends of the drive arms 51, 52 to form a pair of frog-leg mechanisms. The first extendable arm assembly includes a pair of strut arms 59, 60 pivotally coupled to the ends of drive arms 51, 52, respectively, at respective pivot points 61, 62. The strut arms 59, 60, in turn, are coupled by pivots 64, 65 to a first wafer carrier 63. The second extendable arm assembly similarly includes a pair of strut arms 66, 67 pivotally coupled to the ends of drive arms 51, 52, respectively, at respective pivot points 68, 69. The strut arms 66, 67 in turn, are coupled by pivots 71, 72 to a second wafer carrier 70. Each strut arm 59, 60, 66, 67 may include a meshing gear 49, shown in FIG. 4, at an end within the carrier 70 to maintain the carrier in rigid radial alignment with the hub 53 as the strut arms are pivoted during operation of the robot. The first and second robot blades or carriers, 63, 70 of each robot assembly are maintained 180° apart from each other about the axis of the hub. In FIG. 1, the wafer carrier 63 is shown in a fully extended position for delivering or retrieving a wafer from chamber 18a and blade 70 is fully retracted from chamber 18b, as is necessitated where a double frog-leg arrangement is used for each robot assembly. In FIG. 2, both wafer carriers 63, 70 are shown retracted from adjacent process chambers.

Figure 3:
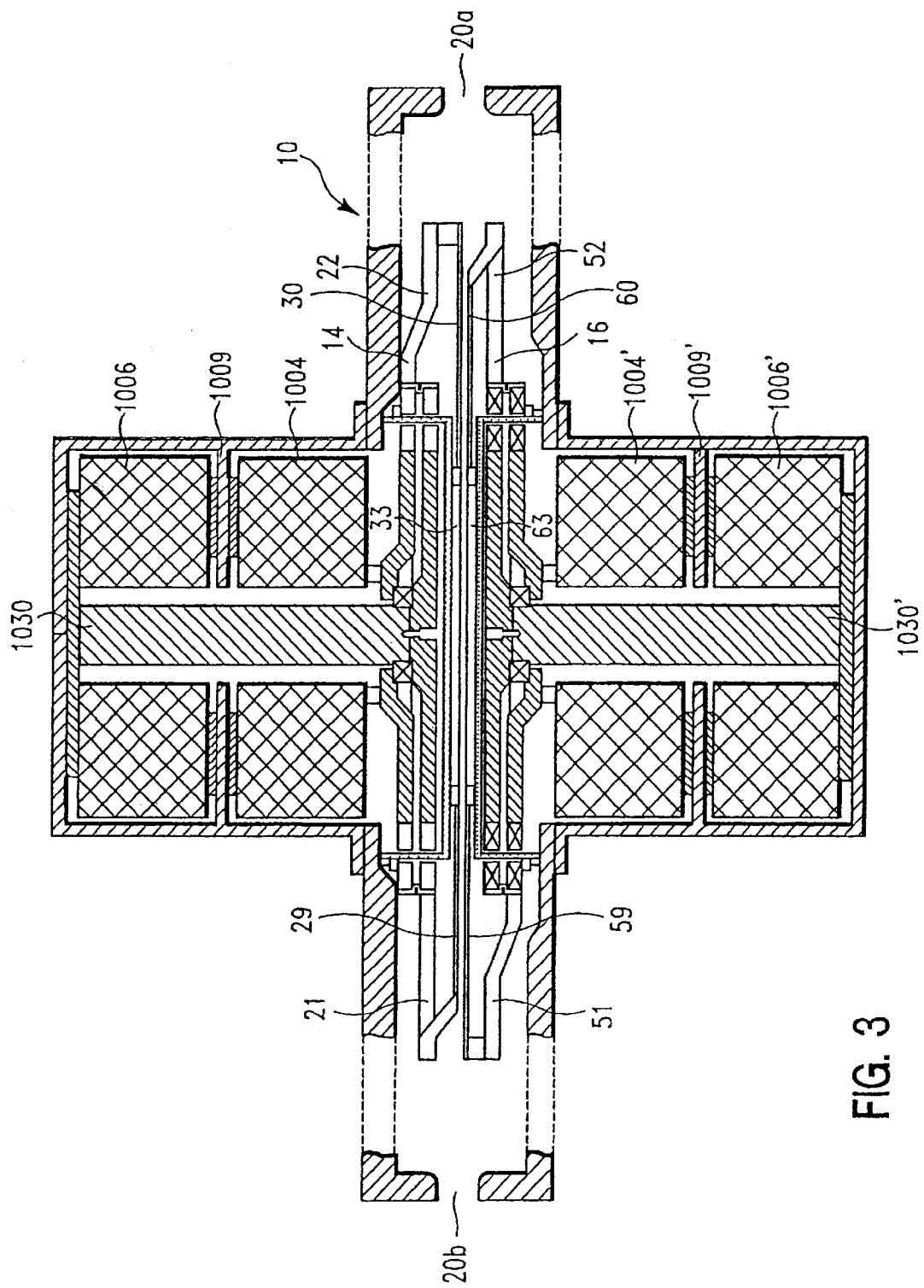
FIG. 3 is a side sectional view of the dual robot assembly of FIG. 2 at 3—3.

Referring still to FIGS. 2 and 3, there is shown a detailed side sectional view of the dual robot assembly of FIG. 2 wherein, all four wafer carriers are in the retracted position and in a transfer chamber 12. To aid interpretation of FIGS. 2 and 3, FIG. 4 shows a simplified plan view of the dual robot assembly 10. As shown in FIG. 3, the upper robot arm assemblies and lower arm assemblies are positioned, with respect to a slit valve 20a aperture, such that a robot blade 33 or 63 (or 40 or 70) from the upper and lower robot assemblies may be passed through the slit valve 20a aperture without the need to change the elevation of the robot arms with respect to the aperture. Thus uniquely, either, or both, of an upper and lower robot carriers 33 and/or 63 (or 40 and or 70) may be passed through the aperture to affect wafer transport to or from the process chamber 18a without the need to swing a robot arm through a significant arc to position the second of the two carriers into a slit valve chamber access position. Another feature of the invention is that the upper robot assembly 14 can operate completely independently of the lower robot assembly 16, allowing the robot assemblies to transfer wafers to or from any chamber, including the same chamber, unimpeded by the presence of the other robot in the transfer chamber. High speed wafer transfer may be accomplished by one robot removing a wafer from a process chamber while the other robot simultaneously inserts a fresh wafer into the same process chamber, or by enabling simultaneous loading or unloading of different chambers, or simultaneous transfer of a wafer in or out of a chamber while a second wafer is moving in a path about the hub and between chambers. Additionally, each robot may rotate entirely past the other, enabling any combination or movement of the upper carriers 33, 40 with respect to the lower carriers 63, 70.

It should be noted that although FIGS. 1–4 show each of the upper and lower robot assemblies 14, 16 being configured as dual blade robots, i.e. two frog-leg mechanisms each connected to a separate wafer carrier, either the upper robot, the lower robot, or both can be a single blade robot. As shown in FIGS. 5–10, a dual robot assembly is provided wherein both the upper and lower robots are single blade robots.

Figure 5:
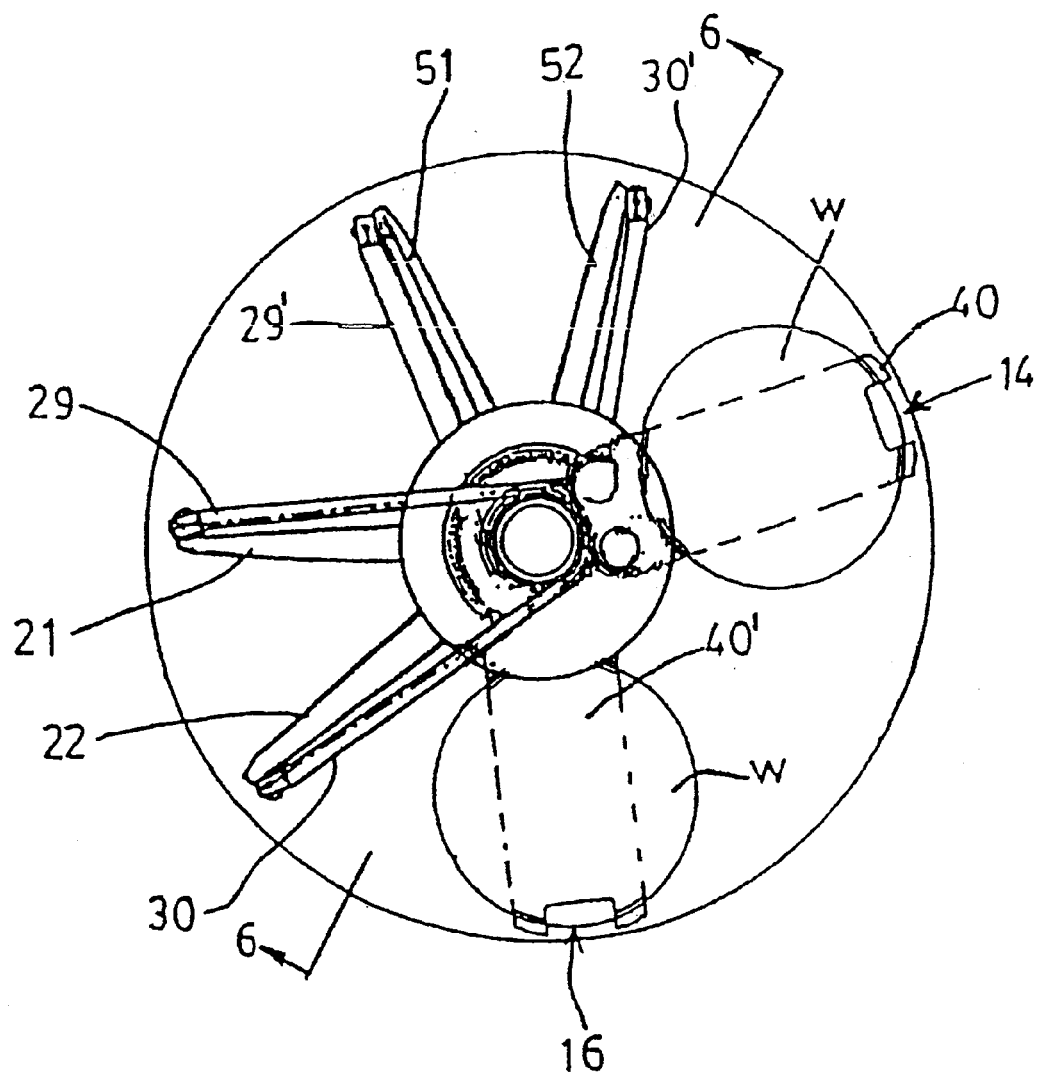
FIG. 5 is a top sectional view of a dual robot assembly according to a second embodiment of the present invention.
Figure 6:
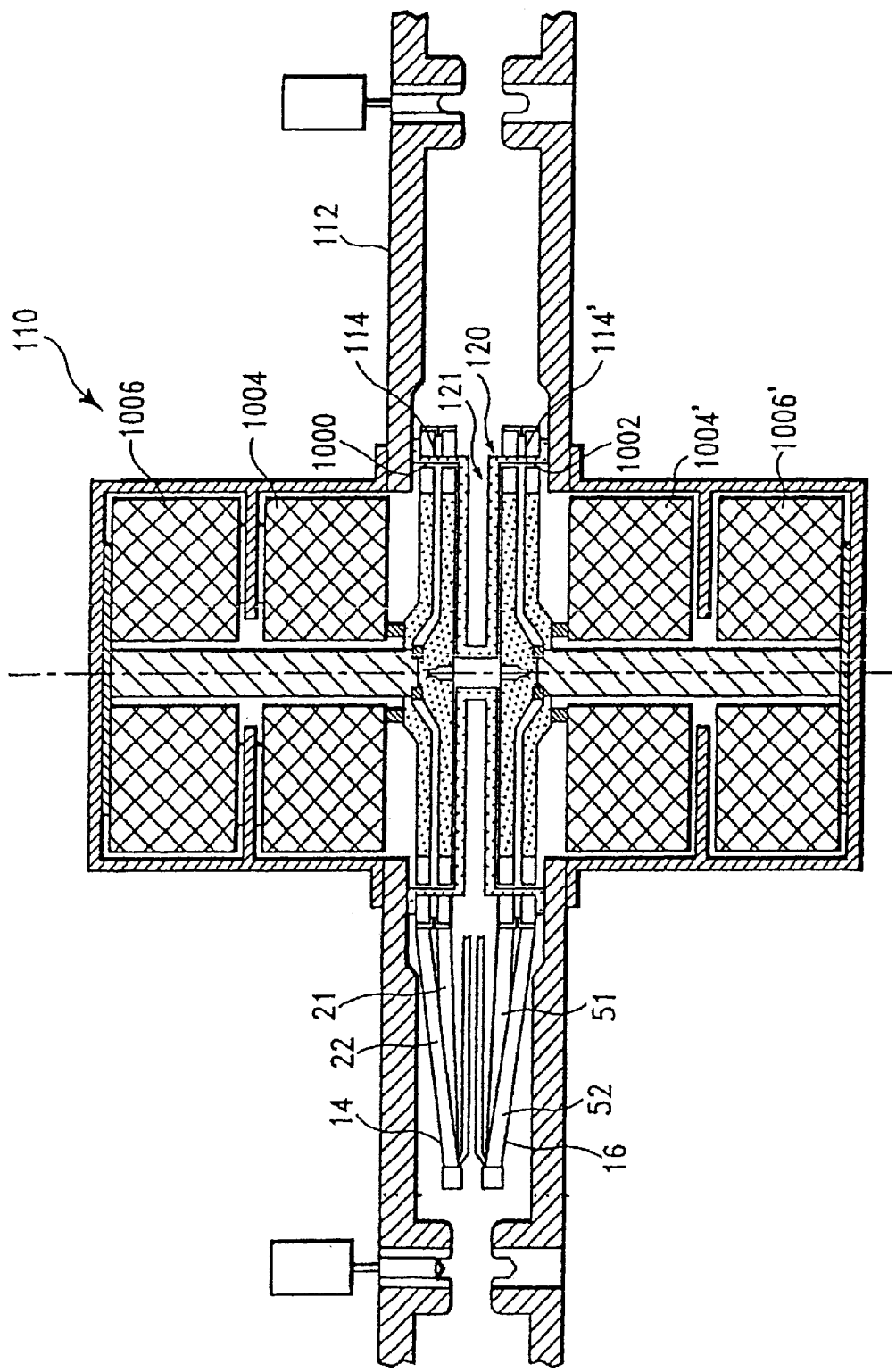
FIG. 6 is a side sectional view of the dual robot assembly of FIG. 5 at 6—6.

An alternative embodiment of the invention is shown in FIGS. 5–7. In this embodiment, the dual robot assembly 110 is centrally arranged within the transfer chamber 112 of the reaction system as described with respect to FIGS. 1 to 4, but a central column 120 spans the gap between the base and cover of the transfer chamber 112. This column 120 ensures that the spacing between the chamber cover and base will remain constant. The column includes an annular clearance recess 121, which provides space for the manipulation of the various arms and carriers of the two robot assemblies 14, 16.

Preferably, the column is provided by extending the thin walled sections 114, 114' of the FIG. 1 embodiment through a necked down region across the gap between the robot assemblies 14, 16 in the transfer chamber 112. Preferably, the thin walled section is formed of nonmagnetic stainless or other material capable of having a magnetic field passed therethrough.

According to this embodiment, two robots 14, 16 are provided in the transfer chamber, each robot with a single blade assembly. Each robot is unrestrained in motion by the other robot, and both robots have independent access to all process chambers surrounding the transfer chamber. According to one preferred use, the robots are capable of simultaneously removing two separate wafers from one or more load-locks. High speed wafer transfer may be accomplished by one robot removing a processed wafer from a process chamber while the other robot simultaneously delivers a fresh wafer to the same process chamber, by simultaneously moving wafer in and out of adjacent or non-adjacent wafer cassettes, and by other simultaneous and independent movement of wafers through a multi-chamber process device. Additionally, each robot assembly 14, 16 could be a dual blade assembly as shown and described with respect to FIGS. 1–4.

Figure 8:
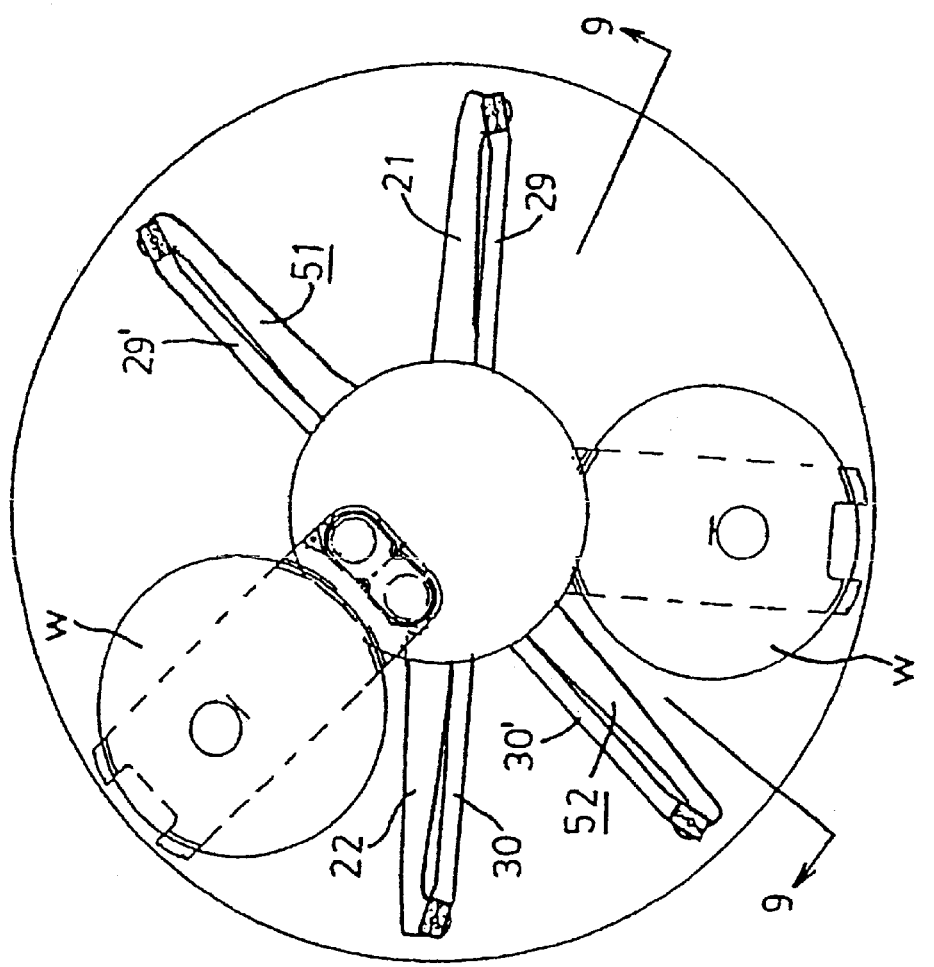
FIG. 8 is a top sectional view of a dual robot assembly according to a third embodiment of the present invention.
Figure 9:
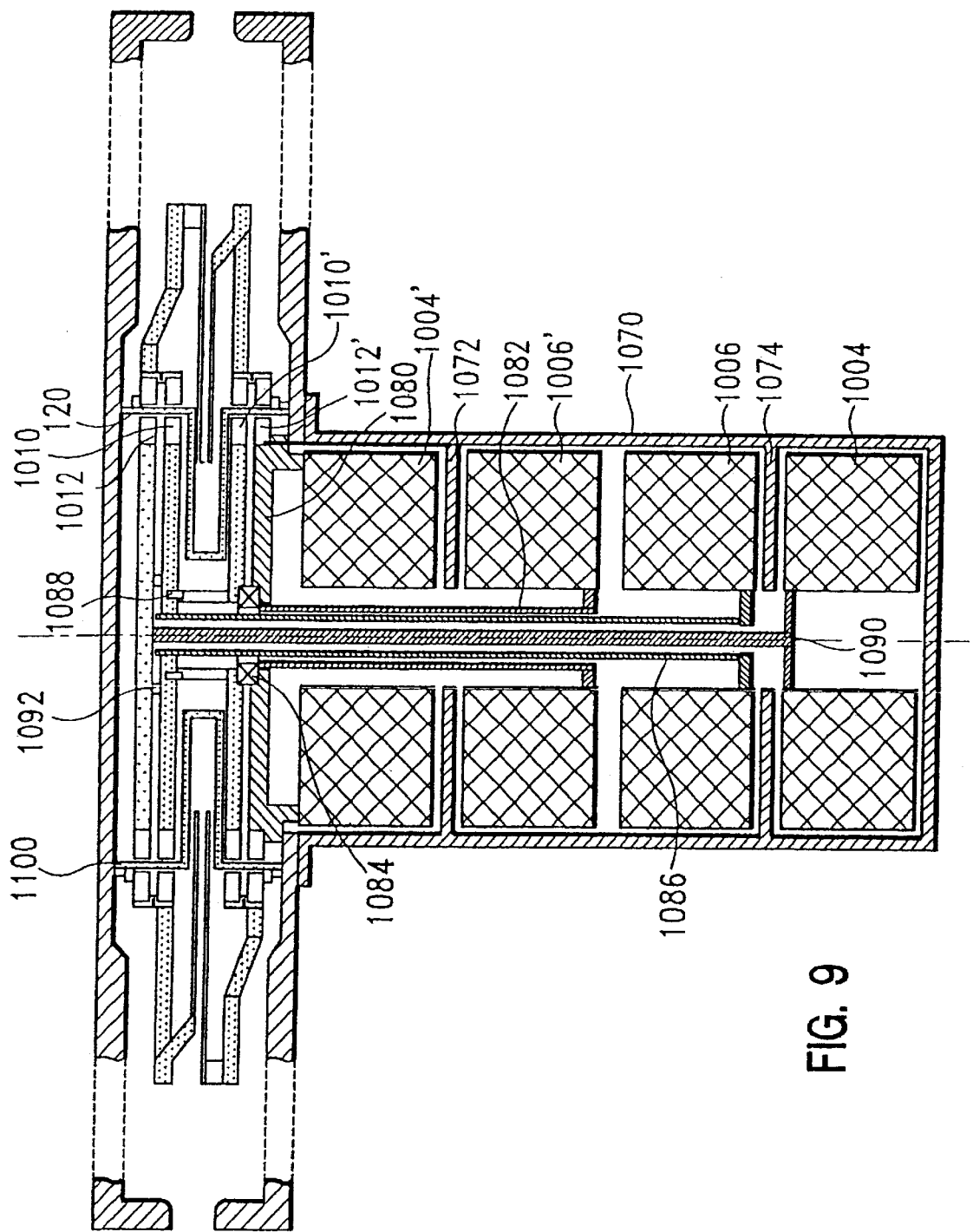
FIG. 9 is a side sectional view of the dual robot assembly of FIG. 8 at 9—9.
Figure 10:
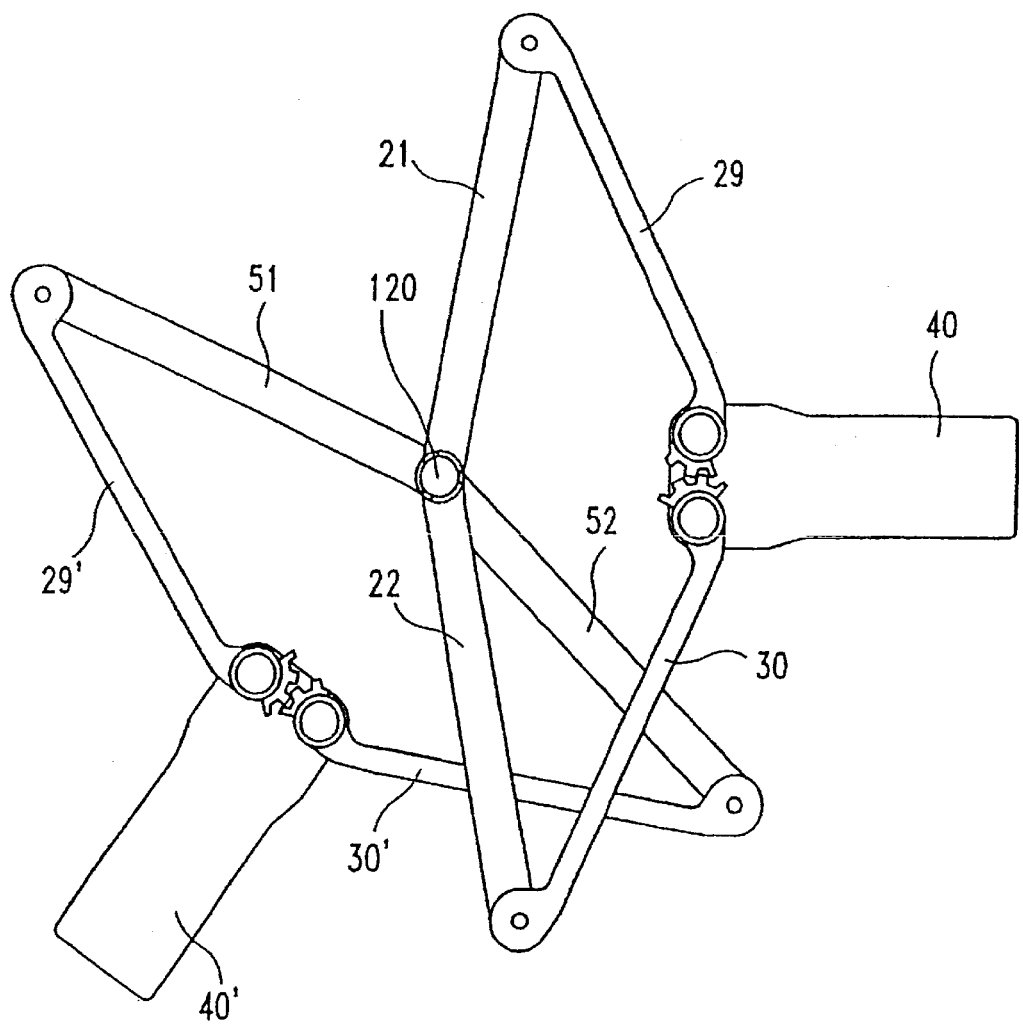
FIG. 10 is a schematic plan view of a single blade robot arm assembly of the dual robot assemblies shown in FIGS. 5–9.

Referring now to FIGS. 8 to 10, a still further embodiment of the invention is shown, wherein the motors for the two robot assemblies 14, 16 are suspended from the transfer chamber. To couple the motor outputs to the driving magnetic ring assemblies, 1010, 1012, 1010', 1012' for each robot assembly, the outputs of the drive motors are coupled to staggered concentric shafts, each of which is coupled to a driving magnetic ring assembly.

Referring to FIG. 9, the drive system includes four motors 1004, 1006, 1004', 1006', having an identical construction as the motor assemblies 1004, 1006 previously described, coupled to a hub 1100 having the same general construction as the central column described with respect to FIGS. 5 to 7. In contrast to the previous embodiments, motors 1004, 1006, for driving the upper robot assembly are suspended below the motors 1004', 1006', for driving the lower robot assembly, and an additional pair of concentric shafts extend from the upper robot assembly motors 1004, 1006 through the center of the lower robot assembly motors 1004', 1006' and the hub 1100, wherein they are connected to magnet ring assemblies 1010, 1012 as previously described. A simplified view of the single blade, dual independent embodiment of the invention is shown in FIG. 10, wherein the central column 120 is shrunken in size to better illustrate the linkages of the apparatus.

The drive motors 1004, 1006, 1004', 1006' are housed in an extended housing 1070, connected to the underside of the transfer chamber 12. The housing 1070 includes a pair of motor support flanges 1072, 1074 therein, to each of which one of upper robot assembly motors 1004, 1006 or lower robot assemblies 1004', 1006' are connected for support and alignment. To support driving magnetic ring assembly 1012' in column 120, the rotor, or output of motor 1004' includes a drive flange 1080 extending therefrom and connected to the driving ring assembly. Thus, the flange 1080 provides support and rotation to the driven magnetic ring 1012'. The output of lower magnetic ring assembly motor 1006' is coupled to a hollow shaft 1082 which extends through motors 1006', 1004 and flange 1080 where it attaches to lower magnetic ring assembly 1010' which is supported on lower magnetic ring assembly 1012' by a bearing 1084. Bearing 1084 is preferably piloted into the ends of both shaft 1082 and flange 1080. A second shaft 1086 extends from motor 1006, through shaft 1082 and the necked down portion of the hub 120 to upper magnetic ring assembly 1010 which is supported on a bearing 1088 connected to the upper surface of the magnetic ring assembly 1010'. The output for motor 1004 is coupled to shaft 1090 which extends through shaft 1086 and connects to magnetic ring assembly 1012 supported on a bearing 1092 connecting magnetic ring assemblies 1010, 1012.

In the embodiment of the invention shown in FIGS. 5 to 7 and FIGS. 8 to 10, the robot assemblies are shown as single blade robots, i.e., where each robot assembly includes only a single robot blade, carrier or end effector. Each embodiment of the drive system may be used with either a single or dual blade robot, and, if desired, a single and a dual blade robot may be used in a single transfer chamber. Referring again to FIGS. 5 to 7, each single blade robot assembly is provided with the same structure as the robot assemblies, including the drive arms 21, 22, (51, 52 in the lower robot assembly 16) coupled to the motors 1004, 1006 and magnetic coupling assemblies 1000, 1002 but, only one pair of strut arms 29, 30 (or, in the lower robot assembly, strut arms 29', 30') coupled to a carrier (blade or effector). Thus, unlike the embodiment shown in FIGS. 1 to 4, each robot assembly 14, 16 can manipulate only a single robot blade, and thus only a single wafer, at any time. FIG. 5 shows the retracted position for the robot assemblies, and FIG. 7 shows the upper robot assembly 14 extended over the lower robot assembly 16 and into an adjacent process chamber. By placing an upper robot assembly 14 over, and in coaxial alignment with, a lower robot assembly 16, the two robot assemblies can be manipulated past one another, and can simultaneously access a single wafer rest position, such as a transfer chamber, thereby enabling rapid deployment and replacement of wafers in the system.

Figure 11:
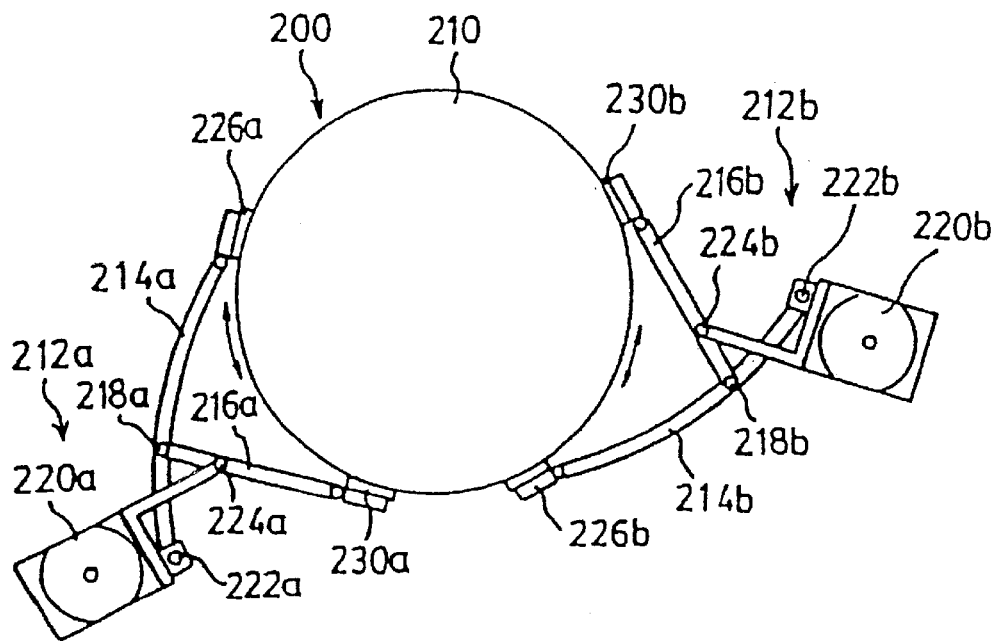
FIG. 11 is a top sectional view of a dual robot assembly according to a fourth embodiment of the present invention.
Figure 12:
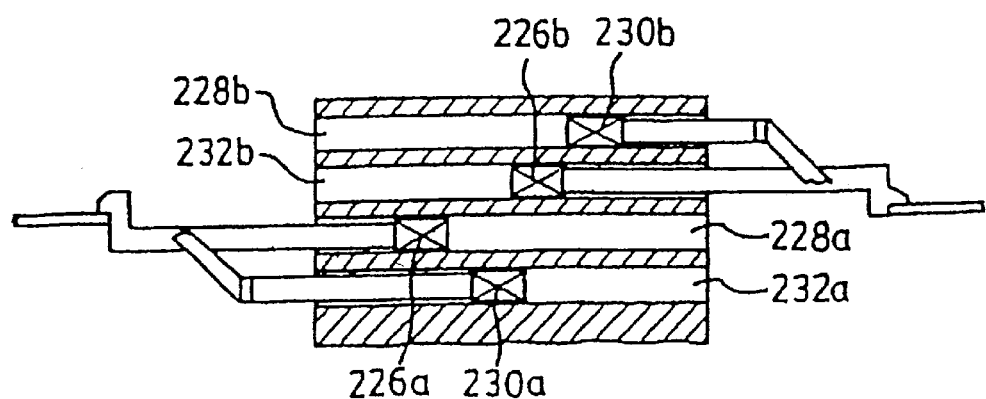
FIG. 12 is a partial side sectional view of the dual robot assembly of FIG. 11.

A fourth embodiment of the dual robot assembly of the present invention is shown in FIGS. 11 & 12. The dual robot assembly 200 according to this embodiment includes a central hub 210 about which a pair of single blade robots 212a, 212b are rotatably mounted. Each robot 212a, 212b includes a drive arm 214a, 214b and a secondary arm 216a, 216b which are connected to one another at a pivot joint 218a, 218b. A robot blade 220a, 220b is provided with each robot 212a, 212b for cradling a wafer during transfer. The robot blades 220a, 220b are connected to one end of the robot drive arm 214a, 214b at a pivot joint 222a, 222b and to one end of the secondary arm 216a, 216b at a second pivot joint 224a, 224b. As best shown in FIG. 12, the erid effectors 220a, 220b are preferably co-planar in the plane of a slit valve. Therefore, each robot's range of rotation about the central hub 210 is limited by the relative position of the other robot. The other end of each of the drive arms 214a, 214b are pivotally connected to a drive block 226a, 226b which are supported on the outer races of bearings 228a, 228blocated on the central hub 210. Similarly, the second end of the secondary arms 216a, 216b are pivotally connected to secondary blocks 230a, 230b which are supported on secondary bearings 232a, 232b in the central hub 210. The bearings are preferably situated in a vacuum environment. Preferably, each bearing is a "cross" type bearing exhibiting both radial and vertical support which is press fit over a central hollow shaft to provide position and support for each robot's arms and blades.

To provide motion to drive arms 214a, 214b of each robot 212a, 212b a central drive assembly 1200 is provided. This central drive assembly 1200 extends inwardly of the chamber 12 to provide positioning and support for each robot 212a, 212b, and to provide a coupling mechanism whereby driving members providing energy to move the drive arms 214a, 214b located within the central drive assembly 1200 and maintained in atmosphere, and driven members located on the exterior of the coupling mechanism and physically linked to the robots 212a, 212b and non-physically coupled to the driving members.

In the preferred implementation of the invention, the motor and magnet ring assembly of FIG. 1 is used to control the movement, or non-movement, of each drive arm 214a, 214b. To provide this, the drive system of FIG. 1 is modified, such that the driven magnetic rings 1016, 1018 are attached, such as by bolts, to the outer races of the bearings 232a, 232b.

To extend the robot blade the drive block is moved in the direction of the secondary block by actuating motor 1004 magnetically coupled to bearing 232a, which is held stationary by preventing rotation of motor 1006 magnetically coupled to the outer race of the bearing 232b. Similarly, to retract the robot blade, the drive block is moved away from the stationary secondary block. Movement of the blocks toward one another causes extension of the robot arm. Movement of the blocks away from one another causes the robot arm to be retracted.

The robot 212a, 212b is rotated about the hub by rotating the drive block with motor 1004 while simultaneously rotating the secondary block with motor 1006 in synchronism with the movement of the drive block.

Figure 13:
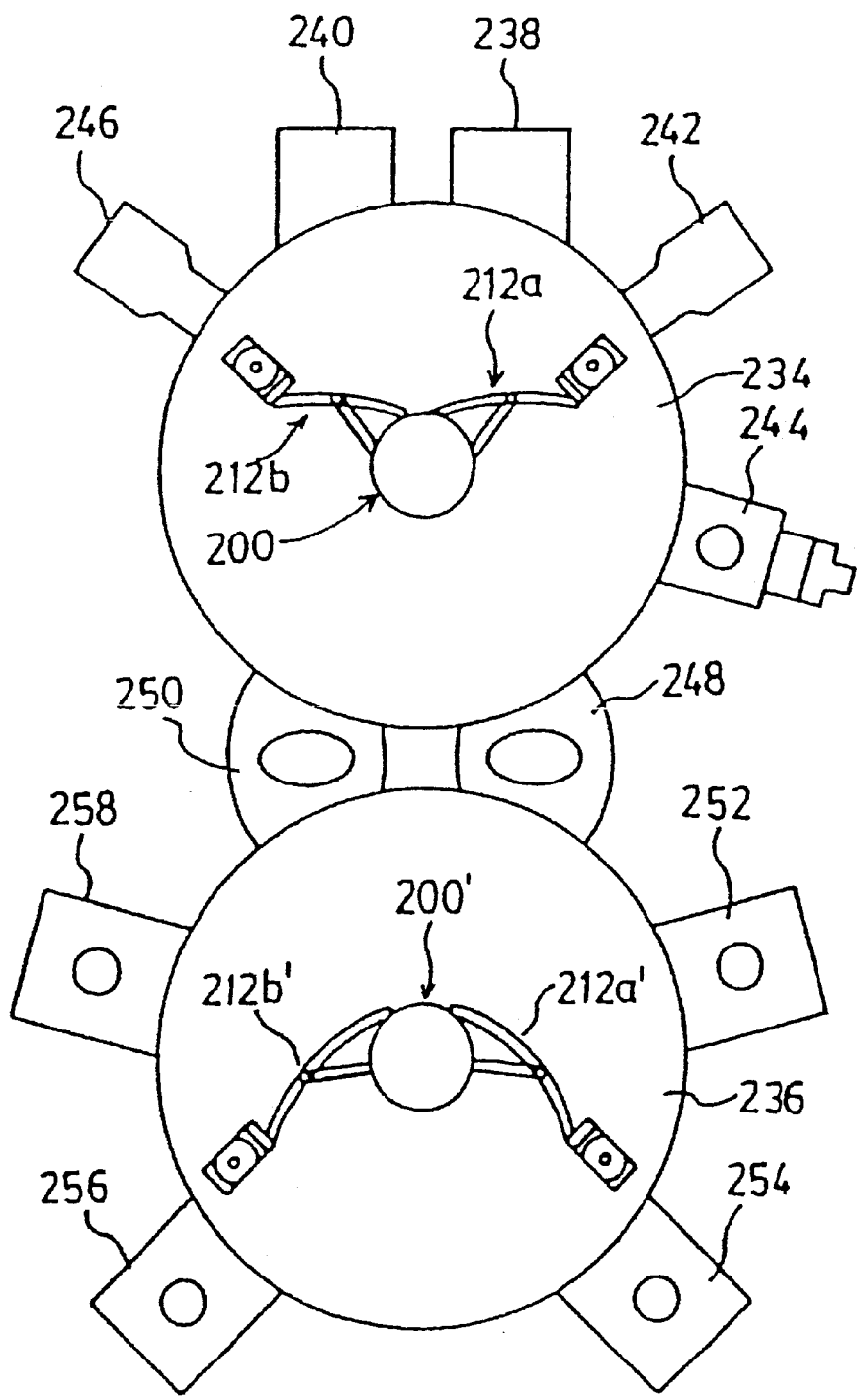
FIG. 13 is a top plan view of a semiconductor wafer processing system using a pair of dual robot assemblies as shown in FIG. 12.

As shown in FIG. 13, the dual robot assembly of the present invention is preferably utilized to transfer semiconductor wafers between individual chambers to affect wafer processing. FIG. 13 shows a first dual robot assembly 200 positioned within a first transfer chamber 234, and a second dual robot assembly 200' positioned within a second transfer chamber 236. First and second load-lock chambers 238, 240, for load-locked transfer of wafers between atmosphere and first transfer chamber 234 are coupled to first transfer chamber 234. First and second pass through chambers 248, 250 connect first and second transfer chambers 234, 236 to enable the passage of wafers W therebetween. Although FIG. 13 shows dual robot assemblies according to the fourth embodiment of the present invention, any dual blade robot capable of simultaneous independent transfer of two wafers such as are disclosed in the other embodiments of the present invention, may effectively be used.

As entry load-lock 238 and an exit load-lock 240 are positioned about the periphery of the pre/post process transfer chamber 234 for transferring wafers into and out of the system. A plurality of process chambers, such as degas chamber 242 and pre-clean chamber 244, and post-processing chambers 246 are also positioned about the first transfer chamber 234 for carrying out a variety of operations. A plurality of process chambers 252, 254, 256, 258 may be positioned around the periphery of the process transfer chamber 236 for performing various process operations, such as etching, deposition, etc. on semiconductor wafers.

According to the present invention, each of the chambers 242, 244, 246, 252, 254, 256, 258 are configured to simultaneously hold two wafers within the chamber during wafer transfers. This enables the system to "feed forward" wafers without the need for a second robot end effector, such as is shown in FIG. 4, to store a wafer while an opposing end effector and robot arm assembly initiates a transfer. Thus the ability to store two wafers within a chamber during wafer transfer can be optimally used in association with multiple independent single blade transfer robots, such as those shown generally in FIGS. 10 & 11.

Figure 14:
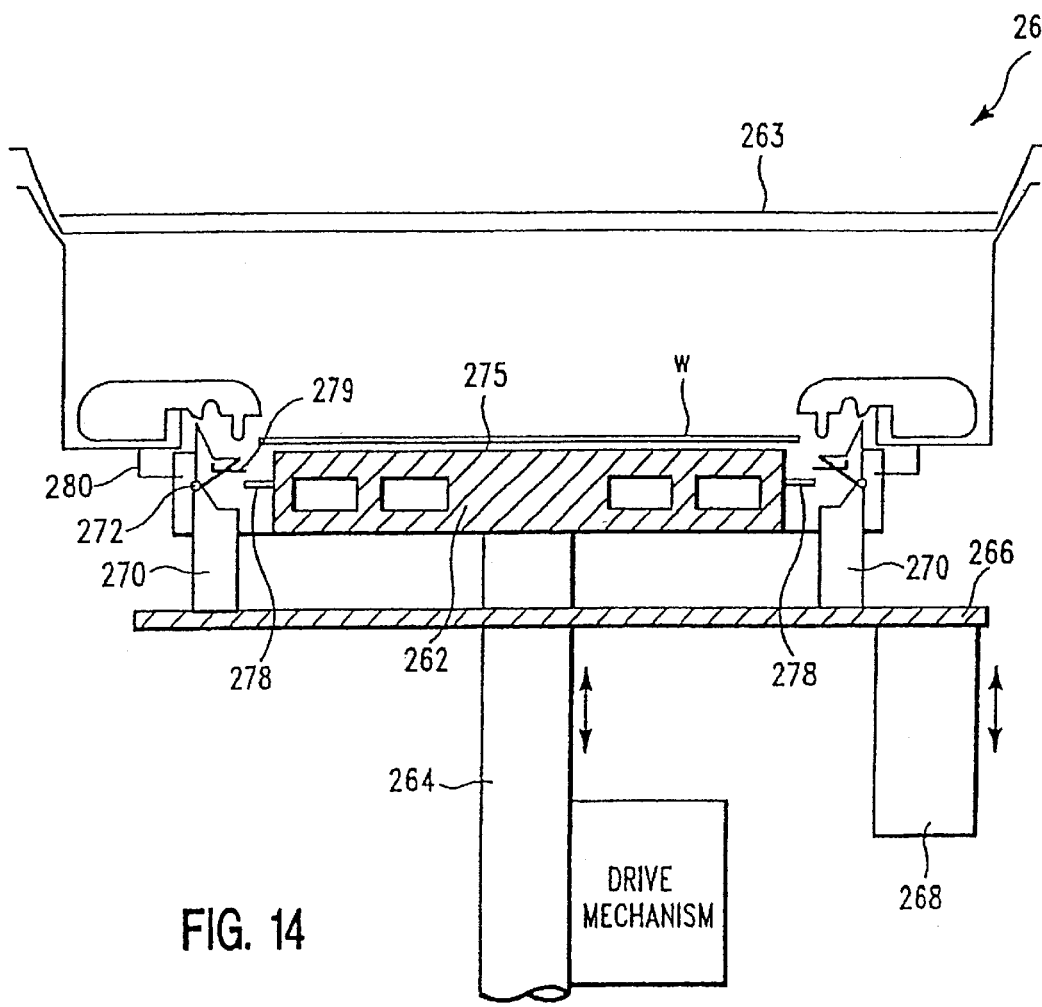
FIG. 14 is a side sectional view of a wafer lift and support apparatus in a chamber of the semiconductor wafer processing system shown in FIG. 13.
Figure 15A:
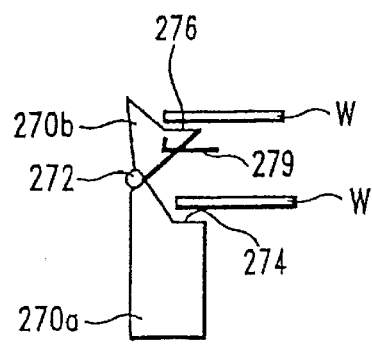
FIG. 15A is a detailed side view of a portion of the lift pin assembly of the wafer lift and support apparatus of FIG. 14, shown in the closed position.

A typical process chamber 260 configured to hold two wafers during transfer operations is shown generally in FIG. 14. A wafer W is positioned on a pedestal 262 located within the process chamber 260 for processing. A shield 263 is located above, and surrounding, the pedestal 262. The pedestal 262 can be raised or lowered to desired positions within the chamber by a drive mechanism (not shown) such as a stepper motor coupled to a lead screw connected to the drive shaft 264. A lift hoop 266 surrounds the perimeter of the pedestal 262 and can be raised or lowered by a lift hoop drive member 268, which may also be a lead screw coupled to a stepper motor. A plurality of lift pins 270 extend upwardly from the upper surface of the lift hoop 266 to effect wafer placement on the pedestal 262. Although, for clarity, the lift hoop is shown as extending outwardly from the perimeter of the pedestal 262, in actuality, the hoop and pedestal are configured such that the pedestal 262 includes a plurality of slots extending inwardly of the perimeter thereof, into each of which a lift pin extends. Thus, the engagement of the lift pin to the wafer occurs within the envelope of the pedestal, and therefore the wafer edge will not overhang the pedestal perimeter. The lift pins according to the present invention exhibit a hinge 272 connecting a lower pin segment 270a to an upper pin segment 270b. The lower pin segment 270a exhibits a substantially parallel wafer support surface 274 to the wafer support surface 275 of the pedestal 262 for holding a lower of two wafers to be held during wafer transfer. When the upper pin segment 270b is in the upright position, as shown in FIG. 15A, a wafer support surface 276 is oriented in a substantial upper parallel position to surface 274 for receiving a second of the two wafers to be held within the chamber.

Figure 15B:
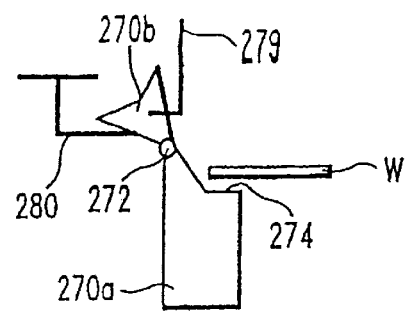
FIG. 15B is a detailed side view of a portion of the lift pin assembly of the wafer lift and support apparatus of FIG. 14, shown in the open position.

In operation, a first wafer is inserted into the chamber 260 by the transfer chamber robot in the conventional manner placed above the two pin segments 270a, 270b, and picked up by the lift pins 270 on the pin segment 270b by moving the lift pins 270 upwardly to lift the wafer from the robot blade. Then, after the robot blade has been retracted, the pedestal 262 is raised to pick the wafer up from the lift pins 270, positioning the wafer W on the upper surface of the pedestal 262. Uniquely, the pedestal, 262 shield 263 and lift pin, 270 cooperate to affect the use of the upper and lower pin segments 270a, 270b. To provide this feature, a plurality of pedestal pins (or ledges) 278 extend outwardly from the pedestal 262 at the location of each lit pin 270, to act as a toggle lever to lift the upper pin segment and thereby rotate it into a non-wafer support position. To return the upper lift pin segment 270b to its support position, a plurality of pins 280 extend inwardly of shield 263 to engage the underside of upper lift pin 270b and flip it back into a wafer supporting position. After the pedestal 262 lifts the wafer W from the upper pin segment the plurality of pedestal pins 278, engage the underside of the upper pin segment, to flip the upper life pin segment 270b to the open position shown in FIG. 15B. Preferably, the underside of each of the upper pin segments 270b include an extension pin which extends inwardly at the pin segment and forms an engagement surface for pin segment 270b pin 278 contact. The wafer is then processed. After processing, the pedestal 262 lowers the first wafer. Because the upper pin segment has been flipped outwardly, the wafer passes upper pin segment 270b and comes to rest on the wafer support surface 274 of the lower pin segment 270a. The lift hoop 266 carrying the plurality of lift pins 270 is then lowered in anticipation of receipt of the next wafer. As the lift pins are lowered, the outer surface of the upper pin segment 270b strikes against pin 280, extending from shield 263 which causes the upper pin segment 270b to be rotated back to the upright or closed position shown in FIG. 15A for receipt of an additional wafer thereon. The transfer robot then inserts another wafer into the chamber, and the lift pins are raised to position the second wafer on the wafer support surface 276 of the upper lift pin segment 270b. The transfer robot then removes the first wafer from the lower pin segment 270a and the process cycle continues. Thus, the double pin segments 270a, 270b enable storage of a processed wafer on the lower segment, placement of a new wafer on the upper segment by the robot blade, and then removal of the stored wafer with the same blade without the need to move the blade in an orbit about the hub, thereby decreasing wafer handling time.

Semiconductor wafers are transferred into the system through the entry load-lock 238. A first transfer robot arm assembly 212a picks a wafer from the load-lock 238 and moves it into the pre/post processing transfer chamber 234 and then into degas chamber 242. During the degas process, the robot arm assembly 212a picks another wafer from the entry load-lock and carries it into the transfer chamber to await degas. Once the first wafer has been degassed, the pedestal 262 within the chamber lowers the wafer to the lower horizontal wafer support surface 274. The lift pins are then lowered and the upper pin segment is rotated back to the upright position. The second wafer may now be inserted into the degas chamber and placed on the upper wafer support surface 276. Prior to degassing the second wafer, the robot arm assembly 212a removes the first wafer for transfer to the pre-clean chamber 244. During degas of the second wafer and pre-clean of the first wafer, the robot arm assembly 212a picks a third wafer from the entry load-lock and carries it into the transfer chamber to await degas. Once the second wafer has been degassed, the pedestal 262 within the chamber lowers the second wafer to the lower horizontal wafer support surface 274. The lift pins are then lowered and the upper pin segment is rotated back to the upright position. The third wafer may now be inserted into the degas chamber and placed on the upper wafer support surface 276. The second wafer is now removed from the degas chamber for transfer to the pre-clean chamber. Once the first wafer has been pre-cleaned, the pedestal 262 within the chamber lowers the first wafer to the lower horizontal wafer support surface 274. The lift pins 270 are then lowered and the upper pin segment 270b is rotated back to the upright position. The second wafer may now be inserted into the pre-clean chamber and placed on the upper wafer support surface 276. The first wafer is removed for transfer to the cooling chamber 248, where it is stored to await further processing. The pass through chamber cassette is filled, and the wafers are cooled down one at a time.

In the dual robot assembly of the invention, the upper robot and lower robot operate independently from one another. The individual operation of each robot is as described in our prior U.S. patent application Ser. No. 07/873,422, and is expressly incorporated herein by reference. Although the invention is described herein with reference to the preferred embodiments of the dual robot assembly, it is anticipated that modifications will readily suggest themselves to those skilled in the art. For example, it is possible to provide a stacked configuration of more than two robots without departing from the spirit and scope of the invention. Likewise, although the invention has been described herein in terms of robots having frog-leg mechanisms, it is equally applicable to other robot types, where the operation of at least two of the robots is independent of any other in the chamber.

The present invention, therefore, is well adapted to carry out the objects and attain the ends and advantages mentioned as well as others inherent therein. While presently preferred embodiments of the invention are given for the purpose of disclosure, numerous changes in the details will readily suggest themselves to those skilled in the art and which are encompassed within the spirit of the invention and the scope of the appended claims.

What is claimed is:

1. A method for moving a plurality of articles, such as semiconductor wafers, comprising:
    transferring an article to an upper article support surface of an article lifting apparatus,
        wherein the article lifting apparatus comprises a plurality of lift pins, each lift pin having a lower lift pin segment having a lower article support surface, and an upper lift pin segment hingedly connected to the lower lift pin segment and having the upper article support surface;
    transferring the article from the upper article support surface to an article receiving surface of a pedestal;
    pivoting the plurality of lift pins from a closed position to an open position;
    processing the article; and
    transferring the processed article from the article receiving surface to the lower article support surface.

2. The method of claim 1, wherein transferring the article to an upper article support surface further comprises transferring the article from a robot blade to the upper article surface.

3. The method of claim 1, further comprising transferring the processed article from the lower article support surface to a robot blade.

4. The method of claim 1, wherein transferring the article from the upper article support surface further comprises vertically moving the article lifting apparatus and the pedestal independently.

5. The method of claim 4, wherein a portion of the vertically moving pedestal pivots the plurality of lift pins from the closed position to the open position.

6. The method of claim 1, wherein transferring the processed article further comprises vertically moving the article lifting apparatus and the pedestal independently.

7. The method of claim 6, further comprising pivoting the plurality of lift pins from the open position to the closed position.

8. The method of claim 1, further comprising transferring a second article to the upper support surface.

9. The method of claim 8, further comprising transferring the article to a robot blade.

10. The method of claim 1, wherein the article is a semiconductor wafer.

* * * * *